United States Patent
Drabek et al.

(10) Patent No.: US 11,249,136 B2
(45) Date of Patent: Feb. 15, 2022

(54) SWITCH WITH A SIGNAL GENERATING UNIT AND A SELF-TEST UNIT

(71) Applicant: Eaton Intelligent Power Limited, Dublin (IE)

(72) Inventors: Tomas Drabek, Prague (CZ); Adam Gabriel, Prague (CZ)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 17/290,997

(22) PCT Filed: Oct. 1, 2019

(86) PCT No.: PCT/EP2019/076606
§ 371 (c)(1),
(2) Date: May 4, 2021

(87) PCT Pub. No.: WO2020/094301
PCT Pub. Date: May 14, 2020

(65) Prior Publication Data
US 2021/0389374 A1    Dec. 16, 2021

(30) Foreign Application Priority Data
Nov. 7, 2018  (GB) ..................... 1818134

(51) Int. Cl.
*G01R 31/327*   (2006.01)
*H02H 3/33*     (2006.01)
*H02H 3/08*     (2006.01)

(52) U.S. Cl.
CPC ............. *G01R 31/327* (2013.01); *H02H 3/08* (2013.01); *H02H 3/335* (2013.01)

(58) Field of Classification Search
CPC ......... G01R 31/327; H02H 3/08; H02H 3/335
(Continued)

(56) References Cited

U.S. PATENT DOCUMENTS

| | | |
|---|---|---|
| 6,266,219 B1 | 7/2001 | Macbeth et al. |
| 6,421,214 B1 * | 7/2002 | Packard ............... H02H 3/335 361/7 |

(Continued)

FOREIGN PATENT DOCUMENTS

| | | |
|---|---|---|
| EP | 2211437 A2 | 7/2010 |
| FR | 2830692 A1 | 4/2003 |

OTHER PUBLICATIONS

FR 2830692; Schneider electro Ind SA); Apr. 11, 2003 (submitted in the IDS) (Year: 2003).*

(Continued)

*Primary Examiner* — Dharti H Patel
(74) *Attorney, Agent, or Firm* — Leydig, Voit & Mayer, Ltd.

(57) ABSTRACT

A switch includes: at least one conducting line led through the switch; switching contacts arranged in the at least one conducting line; at least one measurement transformer arranged at the at least one conducting line; an electronic trip unit, a measurement-input of the electronic trip unit being electrically connected to a measurement transformer secondary winding of a measurement transformer; a power supply unit; at least one power transformer arranged at the at least one conducting line, the at least one power transformer including a power transformer secondary winding which is electrically connected to the power supply unit in order to supply the electronic trip unit; a signal generating unit for generating a test signal with at least a first predefined frequency, with an output of the signal generating unit being electrically connected to the power transformer secondary winding; and a self-test unit electrically connected to the measurement transformer secondary winding.

9 Claims, 1 Drawing Sheet

(58) Field of Classification Search
USPC .......................................................... 361/42
See application file for complete search history.

(56) References Cited

U.S. PATENT DOCUMENTS

| | | | | |
|---|---|---|---|---|
| 10,859,612 | B2* | 12/2020 | Klapper | ................. H02H 3/044 |
| 2005/0225909 | A1* | 10/2005 | Yoshizaki | .............. H02H 3/042 |
| | | | | 361/42 |
| 2009/0251148 | A1* | 10/2009 | Finlay, Sr | .......... G01R 31/3277 |
| | | | | 324/424 |
| 2018/0149682 | A1* | 5/2018 | Klapper | ................. G01R 21/06 |

OTHER PUBLICATIONS

Mori Mitsugi; Earth leakage tester, EL CB equpped with the same, circuit breaker and insulation monitor; filing date Jun. 19, 2009; Abstract, specification, drawings (Year: 2009).*

* cited by examiner

SWITCH WITH A SIGNAL GENERATING UNIT AND A SELF-TEST UNIT

CROSS-REFERENCE TO PRIOR APPLICATIONS

This application is a U.S. National Phase application under 35 U.S.C. § 371 of International Application No. PCT/EP2019/076606, filed on Oct. 1, 2019, and claims benefit to British Patent Application No. GB 1818134.7, filed on Nov. 7, 2018. The International Application was published in English on May 14, 2020 as WO 2020/094301 under PCT Article 21(2).

FIELD

The present disclosure relates to a switch.

BACKGROUND

Switches or power switches for an automatic interruption of an electric line are well known for many years. Such a switch usually comprises two transformers on each line protected by the switch. A separate power transformer, typically an iron core transformer, and a separate measurement transformer, typically an air transformer, are arranged at each conductor. The power transformer is usually called harvester. The measurement transformer typically comprises a so called Rogowski coil as secondary winding.

The switch further comprises an "electronic tripping unit" (ETU), which is connected to the power transformer for power supply and to the measurement transformer for receiving measurement signals regarding the current in the conductor.

These kind of switches are called "moulded case circuit breakers" (MCCB), with typical current ratings up to 2500 A for regular operation. Further typical switchgears are called "air circuit breaker" (ACB).

Critical parts for the functioning of such switches are the electrical connections between the power transformer and the ETU and also the electrical connections between the measurement transformer and the ETU. If one of these connections is broken the switch is not able to secure an electric net furthermore. Often such broken connections are not identified immediately. Because of the high current ratings of an MCCB a failure of it can cause considerable effects.

SUMMARY

In an embodiment, the present invention provides a switch, comprising: at least one conducting line led through the switch; switching contacts arranged in the at least one conducting line; at least one measurement transformer arranged at the at least one conducting line; an electronic trip unit, a measurement-input of the electronic trip unit being electrically connected to a measurement transformer secondary winding of a measurement transformer; a power supply unit; at least one power transformer arranged at the at least one conducting line, the at least one power transformer comprising a power transformer secondary winding which is electrically connected to the power supply unit in order to supply the electronic trip unit; a signal generating unit configured to generate a test signal with at least a first predefined frequency, with an output of the signal generating unit being electrically connected to the power transformer secondary winding; and a self-test unit electrically connected to the measurement transformer secondary winding, which self-test unit is configured to identify at least a first signal component in a predefined frequency range around a first predefined frequency in a measurement signal delivered by the measurement transformer secondary winding, and configured to output a failure signal in an absence of the first signal component.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention overcomes the drawbacks of the state of the art, and provides a switch with fast detection of a functional fault of the switch itself.

Figure 1:
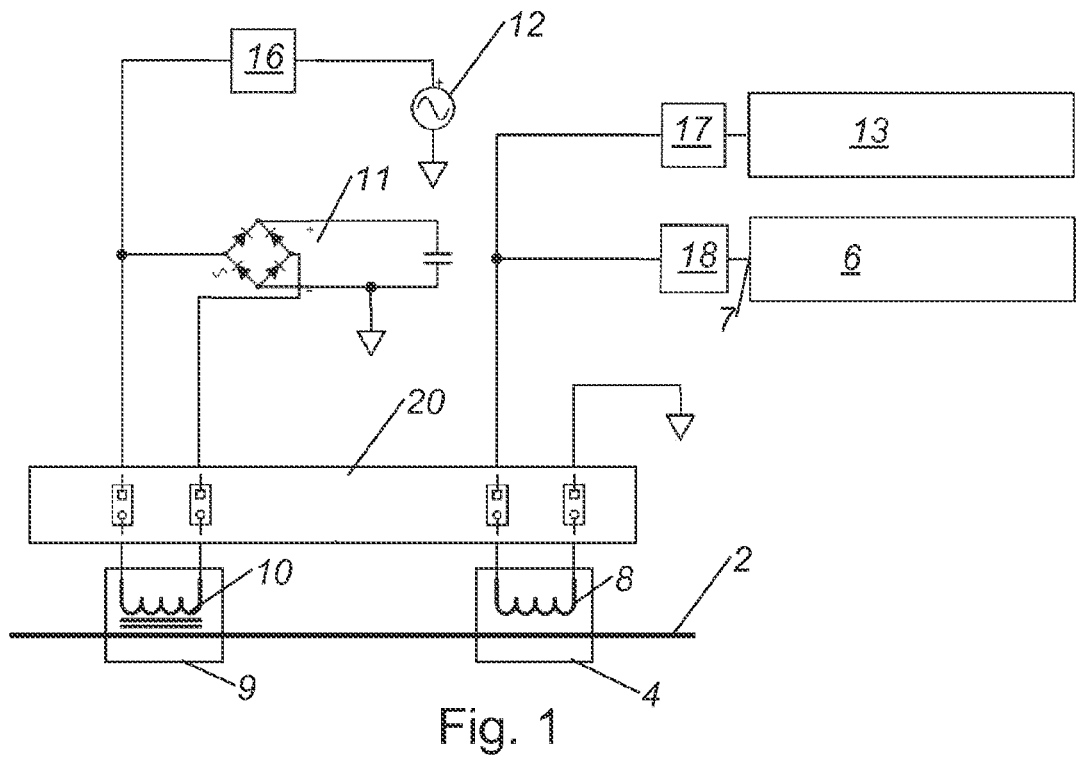
FIG. 1 details of an actual switch as schematic.
Figure 2:
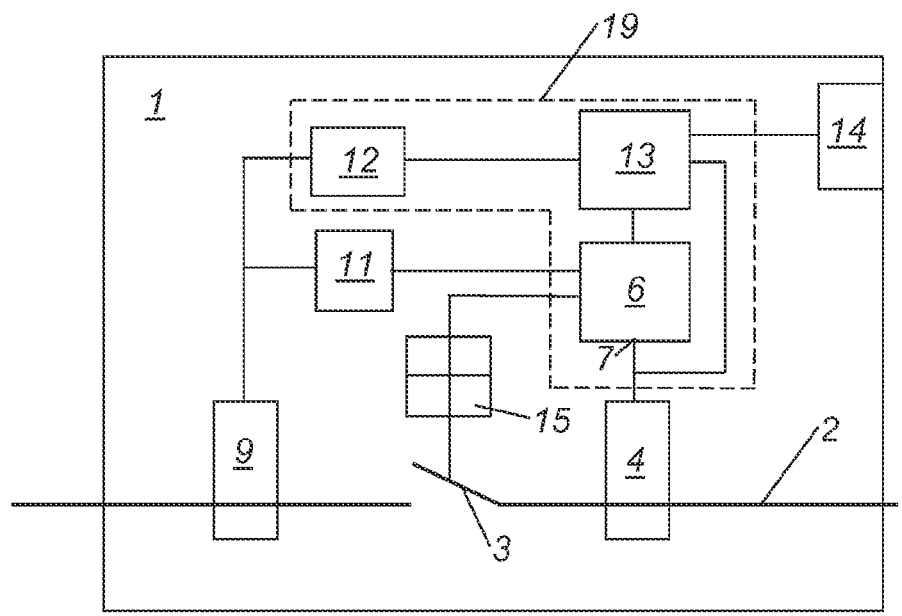
FIG. 2 a block diagram of an actual switch.

As a result a fault of the switch is detected very soon after occurrence, and the electric net can be shut down for repair or replacement of the switch. This helps to reduce heavy electric faults and fires especially in industrial environments. For this the switch needs only a few additional components FIGS. 1 and 2 showing a switch 1 or details of a switch 1, comprising at least one conducting line 2 led through the switch 1, and switching contacts 3 arranged in the conducting line 2, the switch 1 comprising:

at least one measurement transformer 4 which is arranged at the conducting line 2, an electronic trip unit 6, with a measurement-input 7 of the electronic trip unit 6 being electrically connected to a measurement transformer secondary winding 8 of the measurement transformer 4, at least one power transformer 9 arranged at the conducting line 2, the power transformer 9 comprising a power transformer secondary winding 10 which is electrically connected to a power supply unit 11 of the switch 1 for supplying the electronic trip unit 6.

The switch 1 further comprises:

a signal generating unit 12 for generating a test signal with at least a first predefined frequency, with an output of the signal generating unit 12 being electrically connected to the power transformer secondary winding 10, a self-test unit 13 electrically connected to the measurement transformer secondary winding 8, which self-test unit 13 is embodied to identify at least a first signal component in a predefined frequency range around the first predefined frequency in a measurement signal delivered by the measurement transformer secondary winding 8, and which self-test unit 13 is further embodied to output a failure signal in the absence of the first signal component.

As a result a fault of the switch 1 is detected very soon after occurrence, and the electric net can be shut down for repair or replacement of the switch 1. This helps to reduce heavy electric faults and fires especially in industrial environments. For this the switch 1 needs only a few additional components.

The actual switch 1 is preferred a "moulded case circuit breakers" (MCCB) or an "air circuit breaker" (ACB) for low voltage alternating current use.

The switch comprises at least one conducting line 2 led through the switch 1, where three conducting lines 2 are typical for one switch 1. In each conducting line 2 at least a pair of separable switching contacts 3 are arranged. The switching contacts 3 are typically controlled by a mechanical latching mechanism 15.

The switch 1 further comprises a moulded housing or case made of an insulator.

The switch 1 comprises one power transformer 9 and one measurement transformer 4 arranged in series on each conducting line 2, as shown in FIGS. 1 and 2.

The power transformer 9 is preferred embodied as iron core transformer, and is typically called "harvester". The conducting line 2 of the switch 1 is the primary winding of the power transformer 9, which typically passes a hole of the iron core without surrounding the core itself. The power transformer secondary winding 10 is arranged or wound around the iron core.

The power transformer secondary winding 10 is electrically connected to a power supply unit 11 of the switch 1. The power supply unit 11 preferable comprises a well known rectifier unit as shown in FIG. 1

The measurement transformer 4 is preferable embodied as air coil. The conducting line 2 of the switch 1 passes a hole of the air coil without surrounding the coil itself. The air coil or measurement transformer secondary winding 8 is preferable embodied as so called "Rogowski coil". This type of measurement transformer 4 is a standard component in an MCCB.

The switch 1 further comprises an electronic trip unit 6. The electronic trip unit 6 is connected to the power supply unit 11 for the supply with electric energy. A measurement-input 7 of the electronic trip unit 6 being electrically connected to the measurement transformer secondary winding 8. Typically a low pass filter 18 is arranged between the measurement transformer secondary winding 8 and the measurement-input 7 for low pass filtering of a measurement signal delivered by the measurement transformer secondary winding 8. The cut-off frequency of the low pass filter 18 is typically not higher than twice the utility frequency of the network to protect.

The electrical connection between the measurement transformer secondary winding 8 and the electronic trip unit 6 and also the electrical connection between the power transformer secondary winding 10 and the power supply unit 11 is typically and/or preferably embodied as plug and socket connection, comprising a plug connecting array 20, as shown in FIG. 1.

According the invention a test signal is generated and coupled to the conducting line 2 via the power transformer 9, and—if all connections are uninterrupted—is read out by the measurement transformer 4.

The switch 1 comprises a signal generating unit 12 for generating a test signal with at least a first predefined frequency. The generated test signal can comprise a multitude of frequency components. For example the generated test signal may be a rectangular signal, which reduces the effort for the implementation of the signal generating unit 12. If the test signal comprises more than one frequency component the first predefined frequency is the frequency of the lowest frequency component or the fundamental.

Preferably the test signal is a single frequency sine signal, which reduces the effort for the self-test unit 13.

The actual switch is usually embodied to protect an electric network or power line with a utility frequency, which may also be called as power line frequency or mains frequency. This frequency is typically less than 100 Hz, especially it is 16.7 Hz, 25 Hz, 50 Hz or 60 Hz. According the preferred embodiment the first predefined frequency is at least 500 times, especially at least 1000 times, greater than the utility frequency of the network to protect. As the frequency of the test signal is so much higher than the utility frequency, the electronic trip unit 6 would not react on the test signal.

Preferably the first predefined frequency is a frequency in the ITU-Band 5. The ITU is the International Telecommunication Unit. ITU-Band 5 is also called "low frequency band" or LF, and comprises signals with frequencies from 30 kHz to 300 kHz. Test signals with frequencies in this range can be coupled to the conducting line 2 without the need of high signal gain.

Most preferred is a first predefined frequency in the range of 115 kHz to 145 kHz, especially in the rage of 120 kHz to 140 kHz. The best frequency depends on details of the measurement transformer 4 and the power transformer 9 and could further be influenced by every part in the signal line. Preferably a person skilled in the art will choose a definite frequency on basis of a simulation or a test set up of the real embodiment of the switch 1 and measurements over a frequency range. Especially parasitic impedances of the design are hard to estimate or calculate.

According a further embodiment the switch 1 contains a unit for auto tuning of the signal generation unit 12. This makes it possible that the switch 1 self-adjusts itself. As a result also drifts of parameters of one or more components of the switch 1 will not diminish the self-test capabilities of the switch 1.

Devices for generating an electrical signal, especially a single frequency sine signal, with a frequency from 30 kHz to 300 kHz are well known in the field of telecommunication. The signal generating unit 12 is preferably implemented as digital signal generator.

An output of the signal generating unit 12 is electrically connected to the power transformer secondary winding 10 for coupling the signal to the conductor line 2. The signal is transmitted via the power transformer 9 to the conductor line 2 and further to the measurement transformer secondary winding 8. Preferable the signal generating unit 12 is connected to the power transformer secondary winding 10 via a first high pass filter 16, for avoiding DC-currents in the measurement transformer secondary winding 8 and saturation problems with an iron core of the power transformer.

The switch 1 further comprises a self-test unit 13, which is electrically connected to the measurement transformer secondary winding 8. According a preferred embodiment, the self-test unit 13 is connected to the measurement transformer secondary winding 8 via a second high pass filter 17. This helps to reduce the bandwidth of the signal to be analysed, and to lower the SNR in the interesting frequency band.

The cut-off frequency of the high pass filter 17 is typically not lower than the half of the first predefined frequency. Due to the different frequency ranges of the high pass filter 17 and the low pass filter 18 the electronic trip unit 6 would not see the test signal and the self-test unit 13 would not see a fault current with the utility frequency.

The self-test unit 13 and the electronic trip unit 6 work on signals in different frequency ranges. The electronic trip unit 6 is not embodied to detect signals in the frequency range of the test signal. The self-test unit 13 is not embodied to detect signals in the frequency range of the utility frequency.

The self-test unit 13 is embodied to identify at least a first signal component in a predefined frequency range around the first predefined frequency in the measurement signal delivered by the measurement transformer secondary winding 8. As a consequence of non linear effects in the iron core a frequency shift of the first predefined frequency can happen on the way from the signal generating unit 12 to the self-test unit 13. So the signal to be detected can vary in its frequency from the first predefined frequency. According a preferred embodiment, the predefined frequency range is ±3% of the first predefined frequency. As the properties of the iron core can vary according to their temperature the frequency of the detected signal can vary or drift according the current strength in the conduction lines 2.

The signal generating unit 12 is preferably electrically connected to the self-test unit 13 to receive the actual test signal with the first predefined frequency without passing the power transformer 9, the conductor line 2 and the measurement transformer 4. This helps to estimate a frequency of a signal to be detected in the measurement signal.

Preferably the switch 1 further comprises a temperature sensor arranged at the iron core of the power transformer 9, to estimate the amount of a frequency drift.

The self-test unit 13 is further embodied to output a failure signal in the absence of the first signal component.

According a first embodiment the failure signal is transmitted to an information output device 14 of the switch 1. According a simple embodiment the output device 14 is a signal lamp or a display on the housing of the switch 1. According a more sophisticated embodiment, the output device 14 is a telecommunication port, especially an USB-port or an EIB-port or a WLAN interface.

According a second embodiment the failure signal is transmitted to the electronic trip unit 6 to cause an opening of the switching contacts 3. This would switch off the switch 1 and shut down all following electrical devices.

According a preferred embodiment, as shown in FIG. 2 the electronic trip unit 6, the signal generating unit 12 and the self-test unit 13 can be implemented as one single unit, especially in a microcontroller, which is symbolized by the broken lines 19 in FIG. 2.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A switch, comprising:
   at least one conducting line led through the switch;
   switching contacts arranged in the at least one conducting line;
   at least one measurement transformer arranged at the at least one conducting line;
   an electronic trip unit, a measurement-input of the electronic trip unit being electrically connected to a measurement transformer secondary winding of a measurement transformer;
   a power supply unit;
   at least one power transformer arranged at the at least one conducting line, the at least one power transformer comprising a power transformer secondary winding which is electrically connected to the power supply unit in order to supply the electronic trip unit;
   a signal generating unit configured to generate a test signal with at least a first predefined frequency, an output of the signal generating unit being electrically connected to the power transformer secondary winding; and
   a self-test unit electrically connected to the measurement transformer secondary winding, which self-test unit is configured to identify at least a first signal component in a predefined frequency range around a first predefined frequency in a measurement signal delivered by the measurement transformer secondary winding, and configured to output a failure signal in an absence of the first signal component.

2. The switch of claim 1, wherein the first predefined frequency is a frequency in ITU-Band 5.

3. The switch of claim 1, wherein the first predefined frequency is a frequency in a range between 115 kHz and 145 kHz.

4. The switch of claim 1, wherein the test signal comprises a single frequency sine signal.

5. The switch of claim 1, wherein the failure signal is transmitted to an information output device of the switch.

6. The switch of claim 1, wherein the failure signal is transmitted to the electronic trip unit to cause an opening of the switching contacts.

7. The switch of claim 1, wherein the signal generating unit is connected to the power transformer secondary winding via a first high pass filter.

8. The switch of claim 7, wherein the self-test unit is connected to the measurement transformer secondary winding via a second high pass filter.

9. The switch of claim 1, wherein the signal generating unit is electrically connected to the self-test unit.

* * * * *